United States Patent
Lee et al.

(10) Patent No.: US 10,643,817 B2
(45) Date of Patent: May 5, 2020

(54) MICROSCOPE

(71) Applicant: FlowVIEW Tek, Taipei (TW)

(72) Inventors: Hsin-Hung Lee, Taipei (TW);
Cheng-Yu Lee, Taipei (TW)

(73) Assignee: FlowVIEW Tek, Taipei (TW)

(*) Notice: Subject to any disclaimer, the term of this patent is extended or adjusted under 35 U.S.C. 154(b) by 0 days.

(21) Appl. No.: 16/361,227

(22) Filed: Mar. 22, 2019

(65) Prior Publication Data

US 2019/0295812 A1    Sep. 26, 2019

Related U.S. Application Data

(60) Provisional application No. 62/646,372, filed on Mar. 22, 2018.

(51) Int. Cl.
*H01J 37/20* (2006.01)
*B01L 9/00* (2006.01)
*H01J 37/26* (2006.01)

(52) U.S. Cl.
CPC ............ *H01J 37/20* (2013.01); *H01J 37/261* (2013.01); *H01J 2237/2001* (2013.01)

(58) Field of Classification Search
CPC ......... H01J 2237/2003; H01J 2237/188; H01J 2237/2004; H01J 2237/2005; H01J 2237/206; H01J 2237/28; B01L 9/52; B01L 2200/0689; B01L 3/508; G01N 23/2204
USPC ...... 250/306, 307, 310, 311, 440.11, 441.11, 250/442.11; 850/9
See application file for complete search history.

(56) References Cited

U.S. PATENT DOCUMENTS

| | | | | |
|---|---|---|---|---|
| 6,130,434 A * | 10/2000 | Mitchell | ............ | G01N 23/2204 250/310 |
| 7,304,313 B2 * | 12/2007 | Moses | ...................... | H01J 37/20 250/440.11 |
| 7,718,979 B2 * | 5/2010 | Knowles | .................. | H01J 7/228 250/492.1 |
| 8,872,105 B2 * | 10/2014 | Botman | ............. | G01N 21/6458 250/307 |
| 9,466,459 B2 * | 10/2016 | Gardiner | .................. | H01J 37/20 |
| 9,666,409 B2 * | 5/2017 | Damiano, Jr. | .......... | H01J 37/20 |
| 2005/0173632 A1 * | 8/2005 | Behar | ..................... | B01L 3/508 250/311 |
| 2009/0242763 A1 * | 10/2009 | Buijsse | .................... | H01J 7/023 250/307 |
| 2010/0193398 A1 * | 8/2010 | Marsh | .................... | G02B 21/34 206/710 |
| 2015/0348745 A1 * | 12/2015 | Gardiner | ................. | H01J 37/20 250/307 |
| 2019/0295812 A1 * | 9/2019 | Lee | ........................ | H01J 37/261 |

* cited by examiner

*Primary Examiner* — David A Vanore
(74) *Attorney, Agent, or Firm* — JCIP Global Inc.

(57) ABSTRACT

A microscope adapted to observe a sample is provided. The microscope includes a carrier, and the carrier includes a bottom base, an upper cover and a protruding structure. The upper cover is disposed on the bottom base and has an observing region, and the sample is adapted to be observed in the observing region. A first flow passage is formed between the bottom base and the upper cover, the observing region is located in the first flow passage, and a first fluid is adapted to flow through the observing region along the first flow passage. The protruding structure is connected to the bottom base or the upper cover and located in the first flow passage, and the protruding structure surrounds the observing region.

20 Claims, 18 Drawing Sheets

MICROSCOPE

CROSS-REFERENCE TO RELATED APPLICATION

This application claims the priority benefit of U.S. provisional application No. 62/646,372, filed on Mar. 22, 2018. The entirety of the above-mentioned patent application is hereby incorporated by reference herein and made a part of this specification.

BACKGROUND OF THE DISCLOSURE

Field of the Disclosure

The disclosure is related to an observing device, and in particular to a microscope.

Description of Related Art

In general, the most common method for observing the nanogeometry of a substance is to use an atomic force microscopy (AFM), an electron microscope and the like. When measuring with atomic force microscopy, it is required to use a probe to measure the geometry of the object under test. This measuring method not only easily causes the probe to be damaged and requires a long measuring time, but also measures a smaller range of sample; on the other hand, the above issue does not exist in electron microscope. In the case of a scanning electron microscope (SEM), it can be used to observe a liquid sample or a solid sample immersed in a liquid. When observing a liquid sample, the liquid is driven to flow through the film for carrying the sample to carry away the metabolite of the sample, or the liquid is used as a medium to add the required medicament to the sample, wherein the key to successfully observing the liquid sample is to avoid the film from being damaged due to stirring of liquid. In addition, if a solid sample immersed in a liquid needs to be electrified for observation, it is important to know how to provide an electrode for electrifying the sample in the flow passage for accommodating the sample.

SUMMARY OF THE DISCLOSURE

The disclosure provides a microscope that can efficiently stabilize the flow of sample or can electrify the sample in a flow passage for accommodating the sample.

The microscope of the present disclosure is adapted for observing a sample. The microscope includes a carrier that includes a bottom base, an upper cover, and a protruding structure. The upper cover is disposed on the bottom base and has an observing region, and the sample is adapted to be observed in the observing region. A first flow passage is formed between the bottom base and the upper cover, and the observing region is located in the first flow passage. A first fluid is adapted to flow through the observing region along the first flow passage. The protruding structure is connected to the bottom base or the upper cover and is located in the first flow passage, and the protruding structure surrounds the observing region.

In an embodiment of the present disclosure, the at least one of the carriers includes a fastening assembly, and the upper cover is fastened to the bottom base by the fastening assembly.

In an embodiment of the present disclosure, the microscope includes two fixtures, wherein the upper cover and the bottom base are adapted to be respectively engaged with the two fixtures, and the two fixtures are adapted to be rotated relative to each other so that the upper cover is fastened to the bottom base through the fastening assembly.

In an embodiment of the present disclosure, the microscope includes at least one fixture, wherein the upper cover is adapted to be engaged with the at least one fixture, and the at least one fixture has a guiding through hole. The guiding through hole is aligned with the observing region. A needle is adapted to be inserted into the guiding through hole and is aligned with the observing region through the guiding of the guiding through hole and injects the sample into the observing region.

In an embodiment of the present disclosure, the microscope is an electron microscope and includes an electron source adapted to provide an electron beam to the observing region.

In an embodiment of the present disclosure, the protruding structure forms a slow-flow passage around the observing region.

In an embodiment of the present disclosure, the bottom base has a second flow passage, and the second flow passage has a plurality of thermal conductive protrusions. The first flow passage and the second flow passage are stacked on each other, and a second fluid is adapted to flow along the second flow passage to adjust the temperature of the first fluid.

In an embodiment of the present disclosure, the at least one carrier includes at least one elastic sealing component disposed between the bottom base and the upper cover and surrounding the first flow passage.

In an embodiment of the present disclosure, the bottom base includes a base body, a movable component and at least one elastic component. The elastic component is connected between the base body and the movable component. The observing region is aligned with the movable component, and the protruding structure is connected to the upper cover. The movable component is adapted to abut against the protruding structure by the elastic force of the elastic component.

In an embodiment of the present disclosure, the bottom base includes a base body and a thermal conductive component, and the base body surrounds the thermal conductive component. The observing region is aligned with the thermal conductive component, and the thermal conductivity of the thermal conductive component is greater than the thermal conductivity of the base body.

In an embodiment of the present disclosure, the at least one carrier includes a semiconductor component, and the semiconductor component is disposed on the upper cover to form an observing region.

In an embodiment of the present disclosure, the at least one carrier includes another semiconductor component, and the two semiconductor components are respectively disposed on the bottom base and the upper cover and aligned with each other.

In an embodiment of the present disclosure, the protruding structure is formed on one of the two semiconductor components and forms a flow-guiding passage between the two semiconductor components.

In an embodiment of the present disclosure, the upper cover includes an upper cover body and a latching component, and the latching component is engaged with the upper cover body. The semiconductor component is positioned between the latching component and the upper cover body.

In an embodiment of the present disclosure, the latching component has an opening, and the opening is aligned with the observing region.

In an embodiment of the present disclosure, the at least one carrier includes at least one first electrode. The first electrode is disposed on the bottom base and contacts the upper cover. The protruding structure includes at least one second electrode, and the second electrode is disposed on the bottom base. The sample is adapted to contact the upper cover to be electrically connected to the first electrode through the upper cover, and the sample is adapted to be in contact with and electrically connected to the second electrode.

In an embodiment of the present disclosure, the upper cover is a disposable upper cover.

In an embodiment of the present disclosure, the bottom base has an opening, and the first fluid is adapted to leave the first flow passage through the opening to precipitate a sample in the observing region.

In an embodiment of the present disclosure, the bottom base has a carrying portion, and the protruding structure is formed on the carrying portion. The sample is adapted to be carried by the carrying portion and surrounded by the protruding structure.

In an embodiment of the present disclosure, the microscope includes a base, wherein the number of at least one carrier is plural, and the base is adapted to carry the carriers.

Based on the above, in the microscope of the present disclosure, a protruding structure is added to the carrier. The protruding structure may be a slow-flow structure, which forms a slow-flow passage around an observing region of a sample (e.g., a biological cell liquid sample, etc.), so that at least a portion of the first fluid entering the first flow passage flows along the slow-flow passage, thereby avoiding the first fluid from passing through the observing region of the sample in a large amount instantaneously, and thus reducing the degree of disturbance when the first fluid flows through the sample. In this manner, the user can smoothly observe the sample with the microscope. In addition, the protruding structure may be an electrode located in the first flow passage to contact a sample (e.g., a battery material sample, etc.) and electrify the sample to facilitate observation of the sample.

In order to make the aforementioned features and advantages of the disclosure more comprehensible, embodiments accompanying figures are described in detail below.

DESCRIPTION OF EMBODIMENTS

Figure 1:
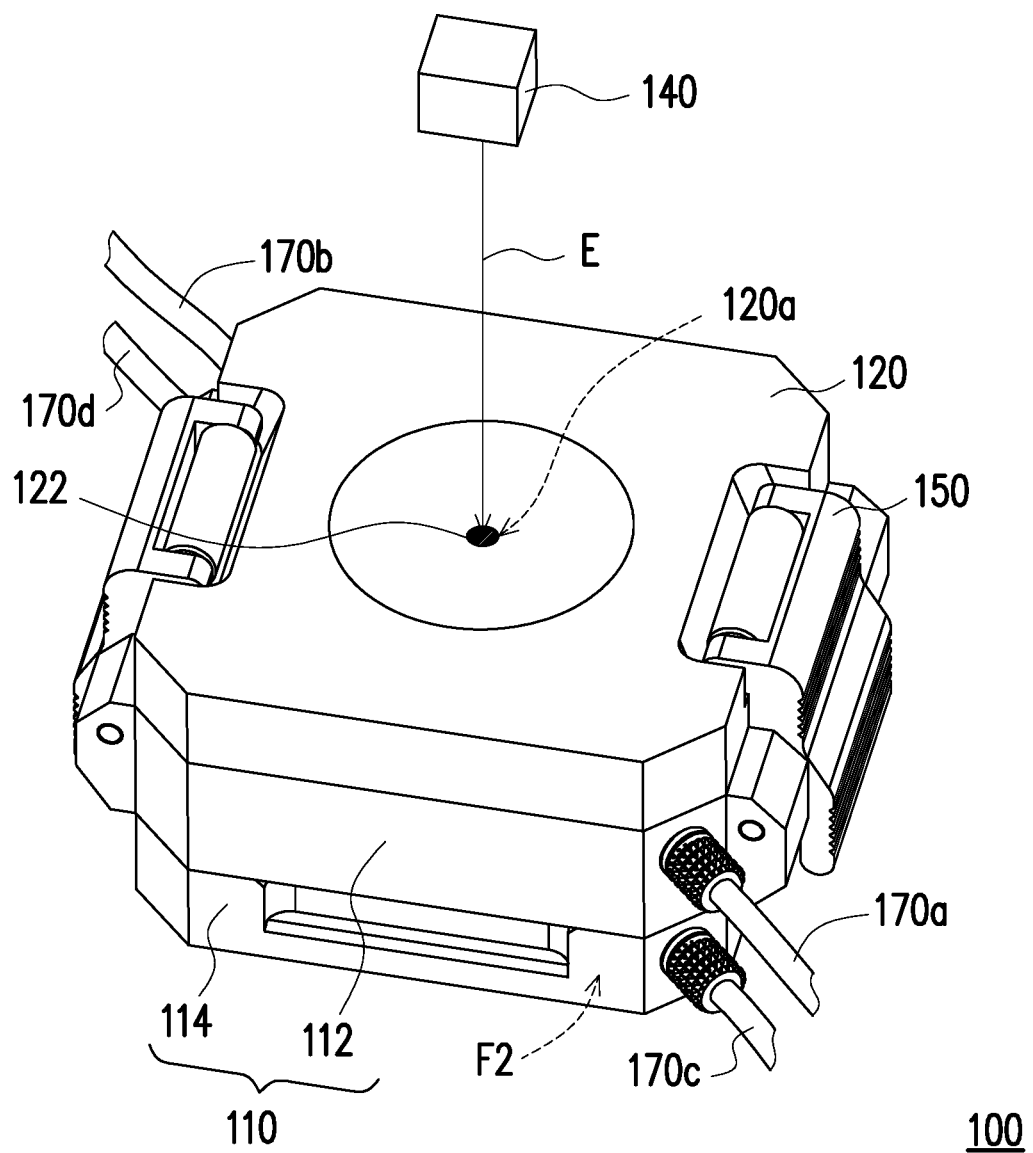
FIG. 1 is a perspective view of a microscope according to an embodiment of the present disclosure.
Figure 2:
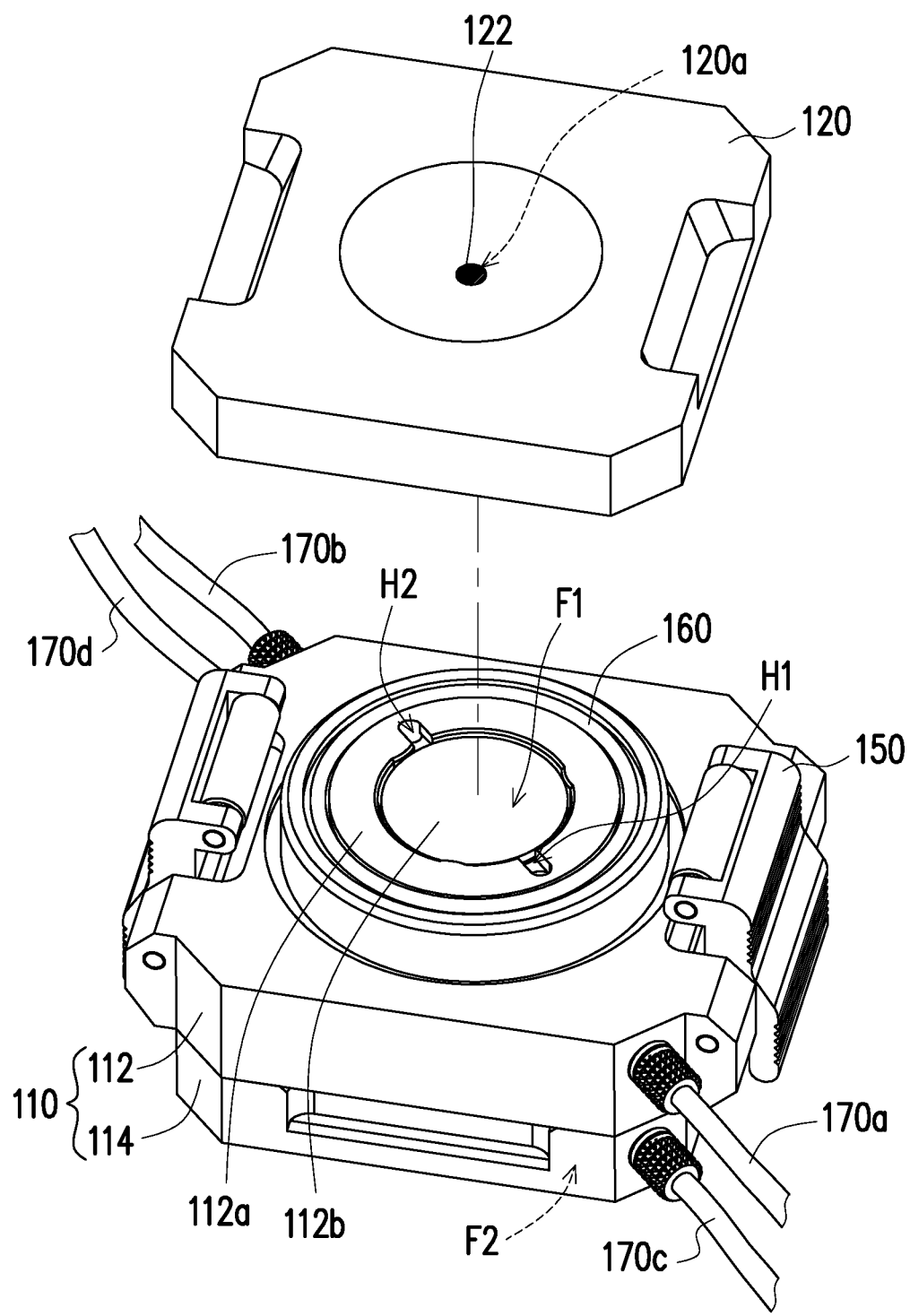
FIG. 2 is an exploded view of a carrier of the microscope of FIG. 1.
Figure 3:
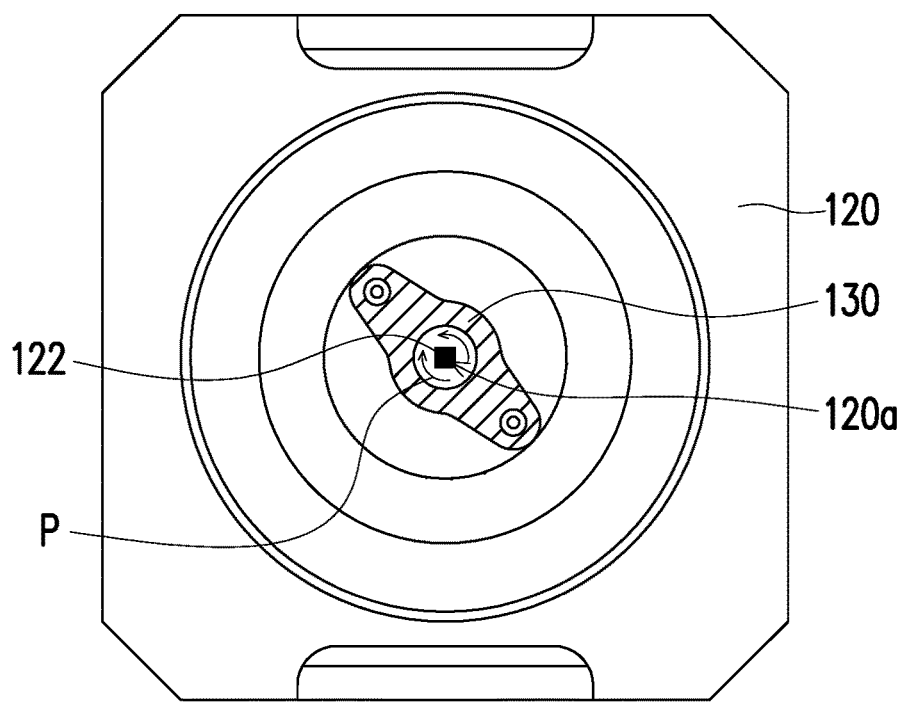
FIG. 3 is a bottom view of an upper cover of FIG. 2.

FIG. 1 is a perspective view of a microscope according to an embodiment of the present disclosure. FIG. 2 is an exploded view of a carrier of the microscope of FIG. 1. FIG. 3 is a bottom view of an upper cover of FIG. 2. Referring to FIG. 1 to FIG. 3, a microscope 100 of the present embodiment includes a carrier including a bottom base 110, an upper cover 120, and a protruding structure 130. The upper cover 120 is disposed on the bottom base 110 and has a semiconductor component 122. The semiconductor component 122 forms an observing region 120a, and a sample (e.g., a biological cell liquid sample or the like) is adapted to be observed in the observing region 120a. A first flow passage F1 is formed between the bottom base 110 and the upper cover 120. The observing region 120a is located in the first flow passage F1, and a first fluid is adapted to pass through the observing region 120a along the first flow passage F1. The protruding structure 130 is connected to the upper cover 120 and located in the first flow passage F1, and the protruding structure 130 surrounds the observing region 120a.

In this embodiment, the microscope 100 is, for example, an electron microscope and includes an electron source 140. The bottom base 110 and the upper cover 120 are disposed, for example, in a vacuum environment, and the electron source 140 is adapted to provide an electron beam E to the sample in the observing region 120a for observation. In other embodiments, the microscope 100 may be other types of microscopes, and the present disclosure provides no limitation thereto. The semiconductor component 122 of the present embodiment is, for example, manufactured through a semiconductor process and has a base and a film formed on the base. The film is, for example, a silicon nitride layer, and the base is, for example, a silicon base. The electron beam E can pass through the silicon nitride layer and act on the object under test. In other embodiments, the semiconductor component 122 may be other suitable materials and can be manufactured in other suitable manners, and the present disclosure provides no limitation thereto.

In the present embodiment, a part of the protruding structure 130 surrounds the observing region 120a as shown in FIG. 3 and forms a slow-flow passage P around the observing region 120a, so that at least part of the first fluid entering the first flow passage F1 flows along the slow-flow passage P, thereby preventing the first fluid from passing through the observing region 120a of the sample in a large amount instantaneously, thus reducing the degree of disturbance when the first fluid flows through the sample, allowing the user to smoothly observe the sample by the microscope 100.

Referring to FIG. 1 and FIG. 2, the carrier of the microscope 100 of the present embodiment includes two fastening assemblies 150, each fastening assembly 150 is, for example, a locking component, and the upper cover 120 is fastened to the bottom base 110 by being locked through the fastening assembly 150. In other embodiments, the fastening assembly 150 can be other forms of components, and the present disclosure provides no limitation thereto. In addition, the bottom base 110 of the present embodiment includes a first portion 112 and a second portion 114. The first flow passage F1 is formed between the upper cover 120 and the first portion 112, and the second portion 114 has a second flow passage F2. The first flow passage F1 and the second flow passage F2 are stacked on each another, and a second fluid is adapted to flow along the second flow passage F2 to adjust the temperature of the first fluid in the first flow passage F1.

Figure 4:
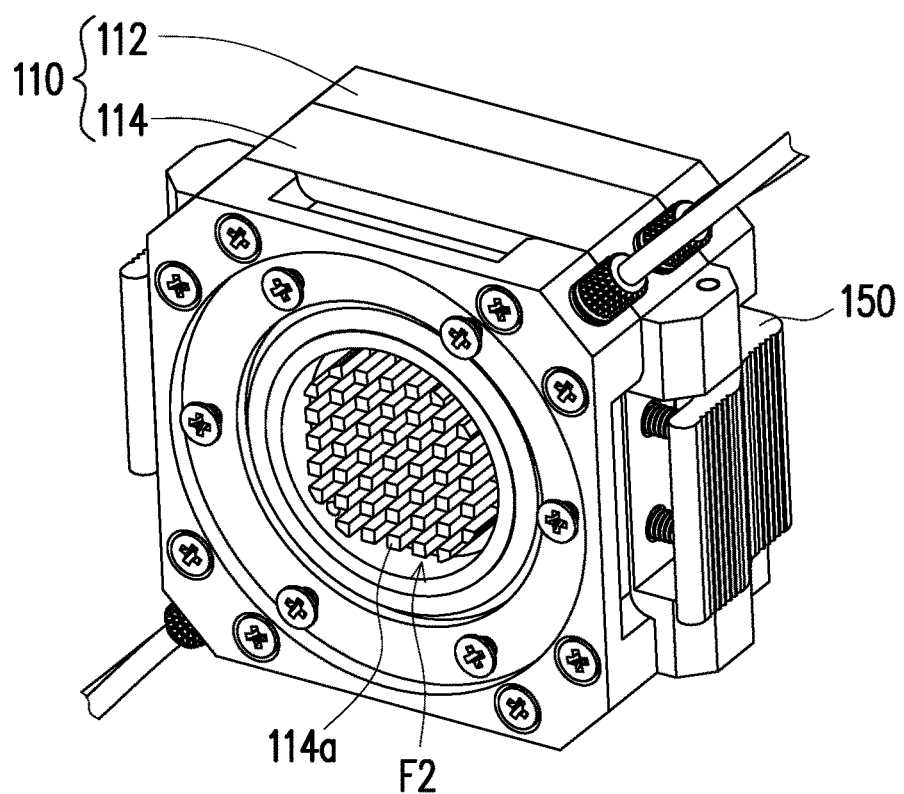
FIG. 4 is a perspective view of a partial structure of the bottom base of FIG. 2 from another viewing angle.

FIG. 4 is a perspective view of a partial structure of the bottom base of FIG. 2 from another viewing angle. As shown in FIG. 4, the second flow passage F2 of the bottom base 110 has a plurality of thermal conductive protrusions 114a for improving the heat exchange efficiency between the second fluid and the bottom base 110. In the present embodiment, the thermal conductive protrusions 114a are a plurality of square pillars, but they may be other suitable shapes, the disclosure provides no limitation thereto. Further, the first fluid flows, for example, in a manner of passing through a pipeline 170a, an inlet H1, the first flow passage F1, an outlet H2, and a pipeline 170b in sequence. Similarly, the second fluid flows, for example, in a manner of passing through a pipeline 170c, the second flow passage F2, and a pipeline 170d in sequence.

Referring to FIG. 2, the carrier of the microscope 100 of the present embodiment includes an elastic sealing component 160. The elastic sealing component 160 is, for example, a circular ring made of rubber material. The elastic sealing component 160 is disposed between the bottom base 110 and the upper cover 120 and surrounds the first flow passage F1 to prevent leakage of the first fluid in the first flow passage F1. In other embodiments, the number of the elastic sealing component 160 may be multiple to achieve a better sealing effect. In addition, the first portion 112 of the bottom base 110 includes a base body 112a and a thermal conductive component 112b. The base body 112a surrounds the thermal conductive component 112b. The observing region 120a of the upper cover 120 is aligned with the thermal conductive component 112b, and the thermal conductivity of the thermal conductive component 112b is greater than that of the base body 112a. In this manner, it is possible for the heat exchange between the first fluid in the first flow passage F1 and the second fluid in the second flow passage F2 to be centralized in the thermal conductive component 112b rather than being carried out in the overall first portion 112 of the bottom base 110, thereby improving heat exchange efficiency. The material of the thermal conductive component 112b is, for example, metal, and the material of the base body 112a is, for example, plastic. However, the disclosure is not limited thereto.

Figure 5:
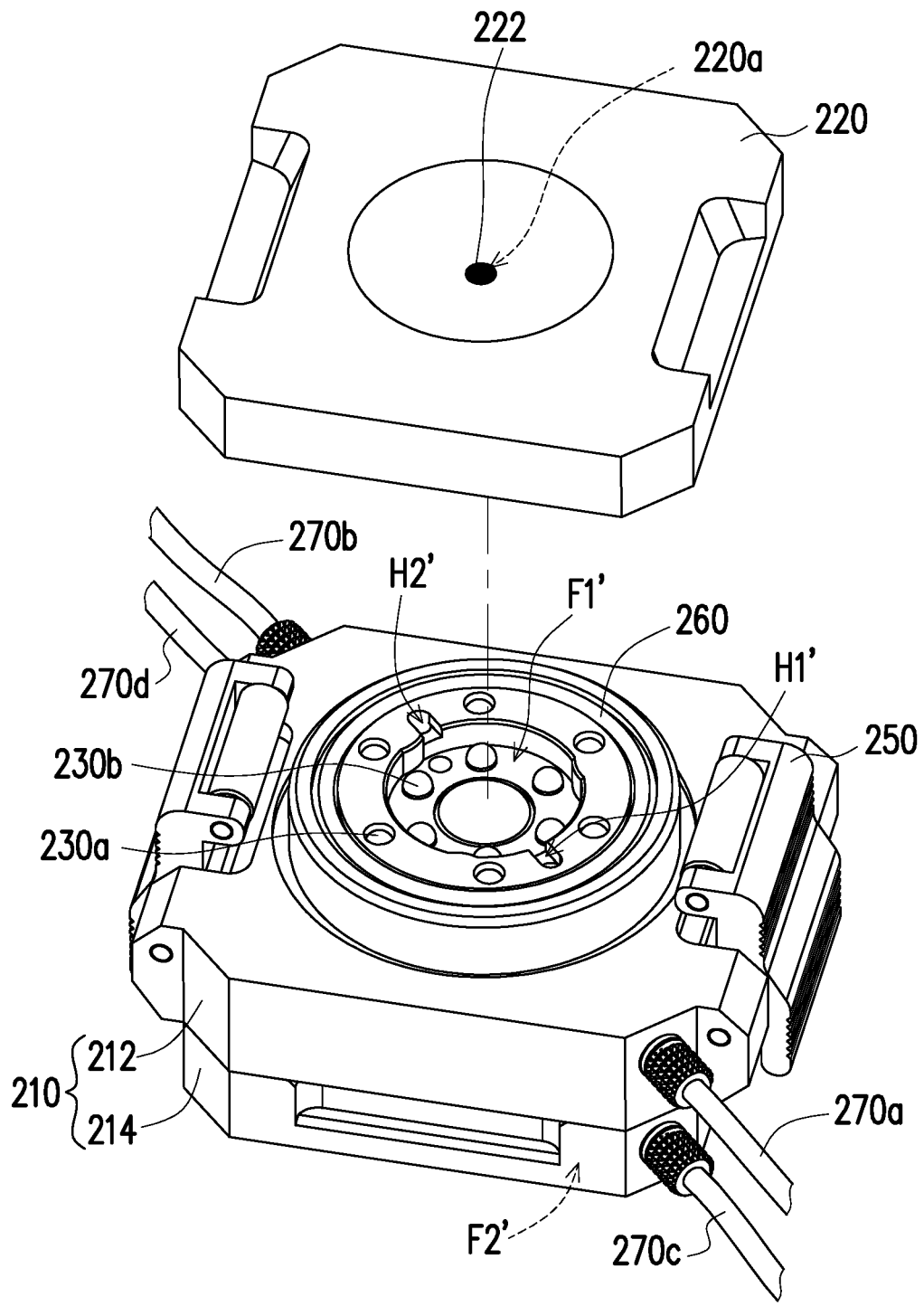
FIG. 5 is an exploded view of the carrier of the microscope according to another embodiment of the present disclosure.

FIG. 5 is an exploded view of the carrier of the microscope according to another embodiment of the present disclosure. In the embodiment shown in FIG. 5, a bottom base 210, a first portion 212, a second portion 214, an upper cover 220, an observing region 220a, a semiconductor component 222, a first flow passage F1', a second flow passage F2', an elastic sealing component 260, a pipeline 270a, a pipeline 270b, a pipeline 270c, a pipeline 270d, an inlet H1', and an outlet H2' are configured and functions in an identical or similar way as the bottom base 110, the first portion 112, the second portion 114, the upper cover 120, the observing region 120a, the semiconductor component 122, the first flow passage F1, the second flow passage F2, the elastic sealing component 160, the pipeline 170a, the pipeline 170b, the pipeline 170c, the pipeline 170d, the inlet H1, and the outlet H2 in FIG. 2, and thus related descriptions are omitted.

The difference between the embodiment shown in FIG. 5 and the embodiment shown in FIG. 2 is that the carrier of the microscope shown in FIG. 5 includes a plurality of first electrodes 230a, and the first electrode 230a is disposed on the bottom base 210 and contacts the upper cover 220. Moreover, the protruding structure in the first flow passage F1' of the present embodiment is a plurality of second electrodes 230b, and the second electrode 230b is disposed on the bottom base 210 and surrounded by the first electrode 230a. The sample (e.g., a battery material sample, etc.) is adapted to contact the upper cover 220 to be electrically connected to the first electrode 230a through the upper cover 220, and the sample is adapted to be in contact with and electrically connected to the second electrode 230b, so that the sample is electrified to generate an electrochemical reaction for observation. By arranging the protruding structures (the second electrodes 230b) around the observing region 220a, the sample can be surely contacted with the second electrode 230b.

Figure 6:
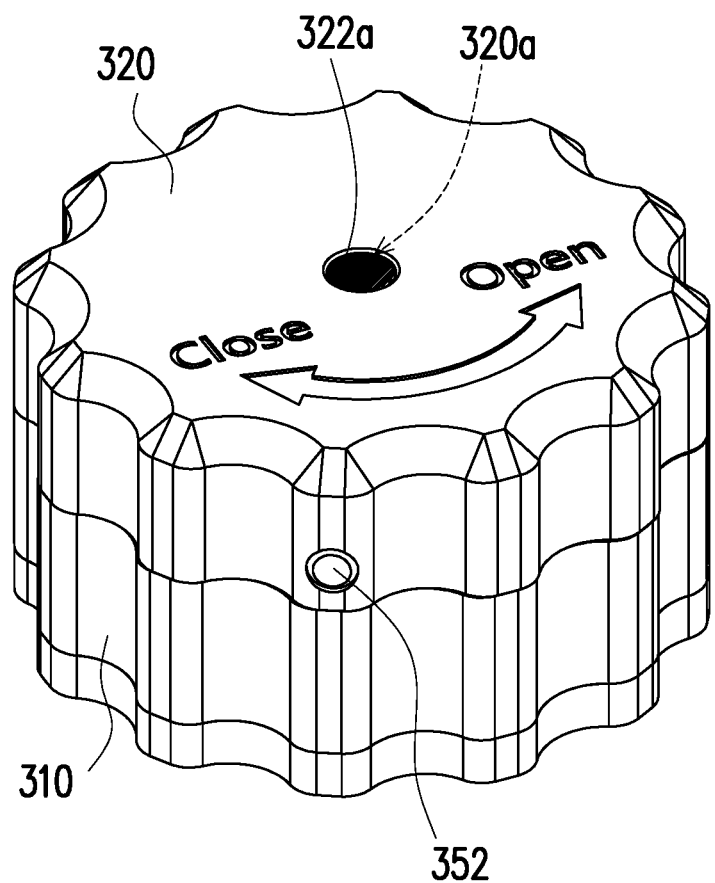
FIG. 6 is a perspective view of the carrier of the microscope according to still another embodiment of the present disclosure.
Figure 7:
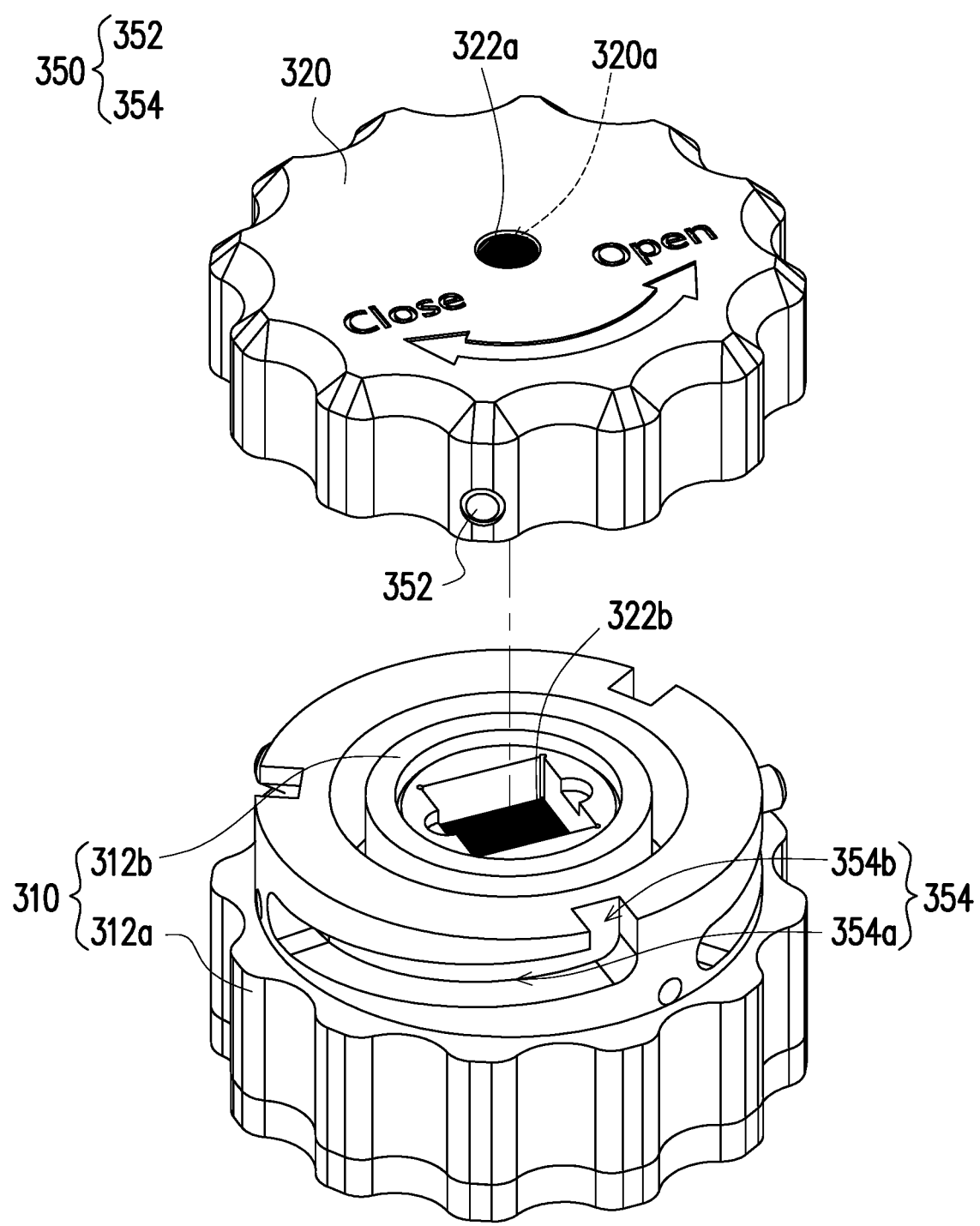
FIG. 7 is an exploded view of the carrier of FIG. 6.
Figure 8:
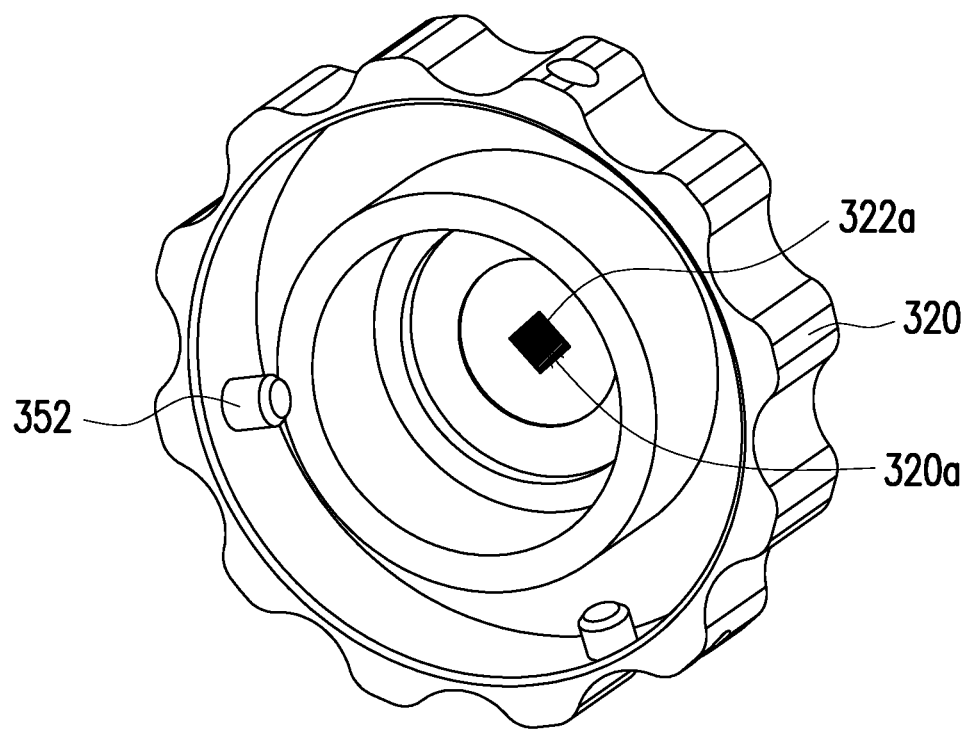
FIG. 8 is a perspective view of the upper cover of FIG. 7 in another viewing angle.

FIG. 6 is a perspective view of the carrier of the microscope according to still another embodiment of the present disclosure. FIG. 7 is an exploded view of the carrier of FIG. 6. FIG. 8 is a perspective view of the upper cover of FIG. 7 in another viewing angle. In the embodiment shown in FIG. 6 to FIG. 8, a bottom base 310, an upper cover 320, an observing region 320a, and a semiconductor component 322a are configured and functions in an identical or similar way as the bottom base 110, the upper cover 120, the observing region 120a, and the semiconductor component 122a of FIG. 2, and thus related descriptions are omitted. The difference between the embodiment shown in FIG. 6 to FIG. 8 and the embodiment shown in FIG. 2 is that the carrier of the microscope shown in FIG. 6 to FIG. 8 includes another semiconductor component 322b, and the two semiconductor components 322a and 322b are respectively disposed on the bottom base 310 and upper cover 320 and are aligned with each other. The protruding structure of the embodiment is a protruding microstructure formed on one of the two semiconductor components 322a, 322b, and the protruding microstructure forms a flow-guiding passage between the two semiconductor components 322a, 322b and surrounds the observing region 320a to guide the fluid to pass through observing region 320a. The advantageous effect of forming the protruding structure on the semiconductor component is that the size of the protruding structure can be made finer through the semiconductor manufacturing process to better meet the design requirements.

Another difference between the embodiment shown in FIG. 6-FIG. 8 and the embodiment shown in FIG. 2 is that the upper cover 320 is a disposable upper cover that can be discarded and replaced with a new upper cover 320 after sample observation. In addition, the fastening assembly 350 of the present embodiment includes a plurality of pillars 352 disposed on the upper cover 320 and a plurality of guiding slots 354 formed on the bottom base 310. Each of the guiding slots 354 includes a guiding segment 354a and a releasing end 354b. Each of the pillars 352 can be moved along the guiding segment 354a along with rotation of the upper cover 320, such that the oblique design of the guiding segment 354a can drive the upper cover 320 to be fastened downward to the bottom base 310. When the upper cover 320 is rotated in the reverse direction, each of the pillars 352 can be moved to the releasing end 354b along with rotation of the upper cover 320, so that the upper cover 320 and the pillar 352 can be separated from the bottom base 310.

Figure 9:
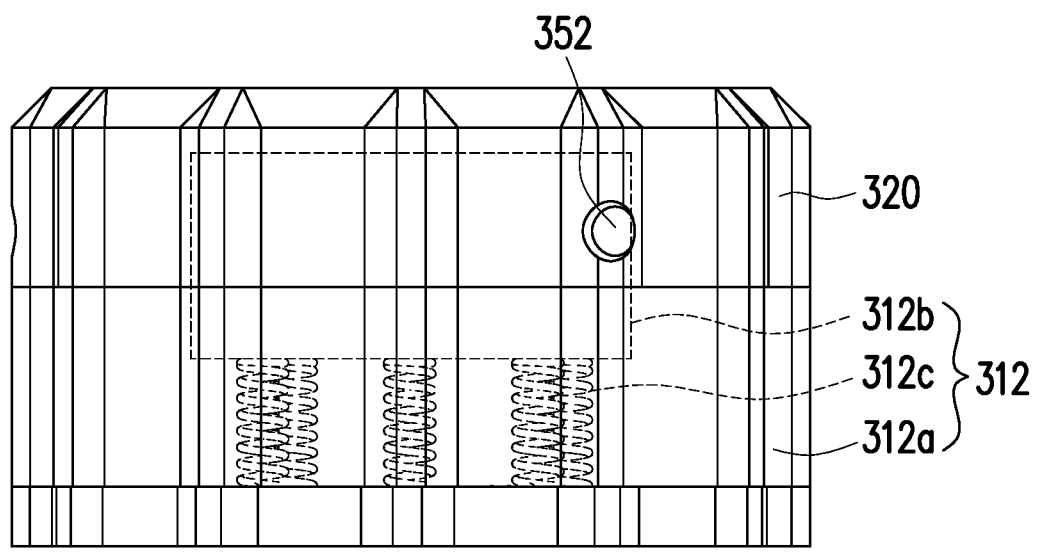
FIG. 9 is a side view of the carrier of FIG. 6.

FIG. 9 is a side view of the carrier of FIG. 6. Referring to FIG. 7 and FIG. 9, the bottom base 310 of the embodiment includes a base body 312a, a movable component 312b and a plurality of elastic components 312c. The elastic component 312c is connected between the base body 312a and the movable component 312b. The observing region 320a of the upper cover 320 is aligned with the movable component 312b. The movable component 312b and the semiconductor component 322b thereon can abut against the protruding structure on the semiconductor component 322a through the elastic force of the elastic component 312c, so that a flow-guiding passage can be surely formed between the semiconductor component 322a and the semiconductor component 322b through the protruding structure. In other embodiments, a lifting mechanism can be added to the bottom base 310 to drive the semiconductor component 322b to ascend to a position after the upper cover 320 and the bottom base 310 are combined, thereby preventing the force generated during combination of the upper cover 320 and the bottom base 310 from causing wearing to the semiconductor component 322b.

Figure 10:
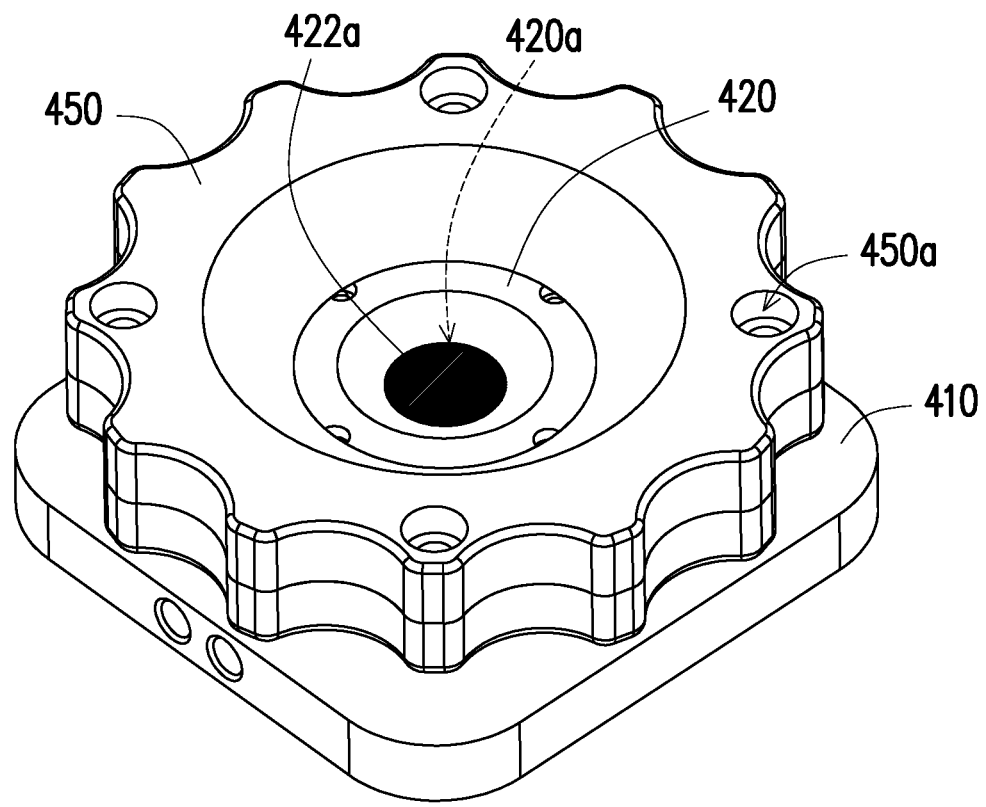
FIG. 10 is a perspective view of the carrier of the microscope according to yet another embodiment of the present disclosure.
Figure 11:
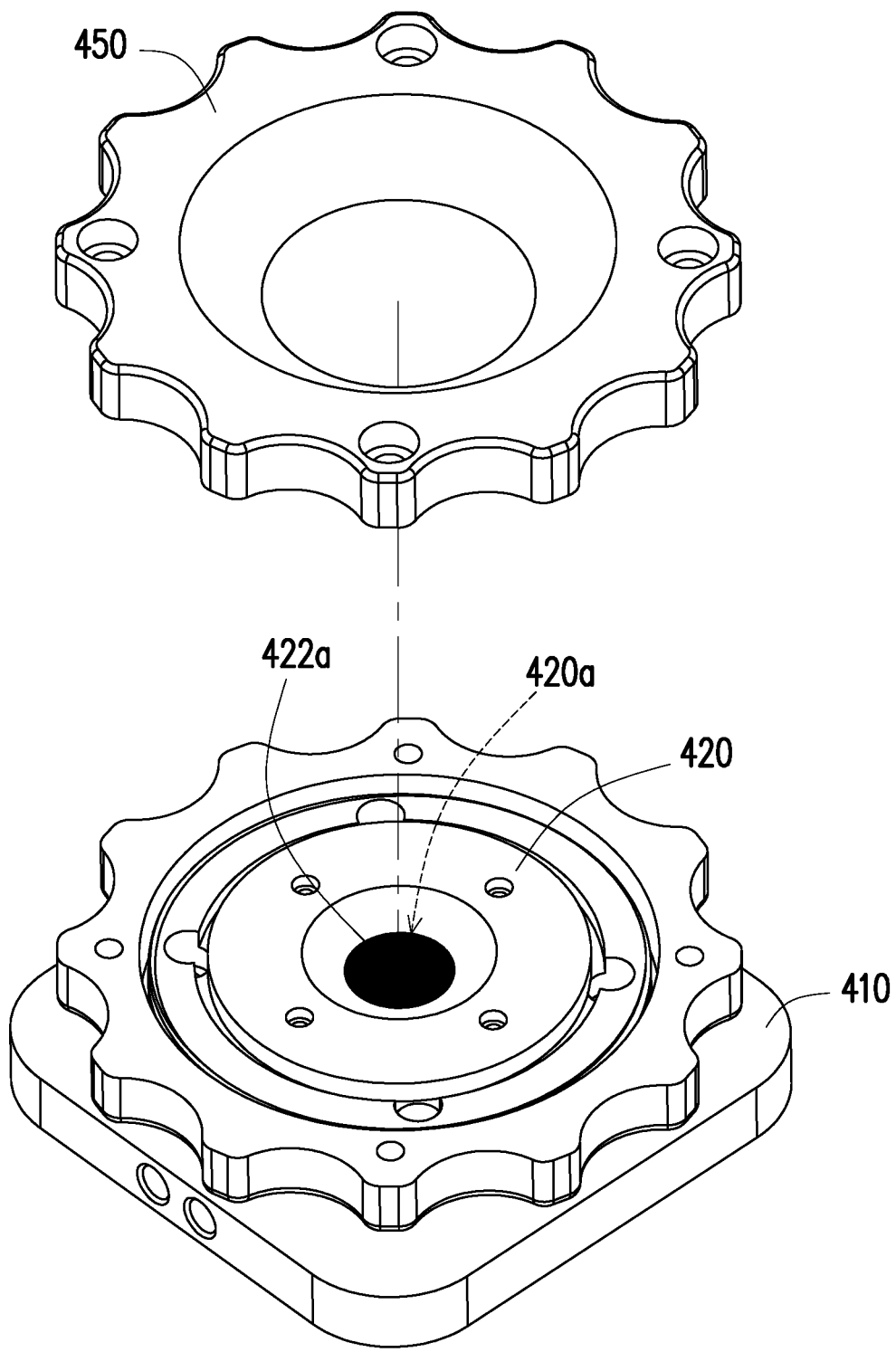
FIG. 11 is an exploded view of the carrier of FIG. 10.
Figure 12:
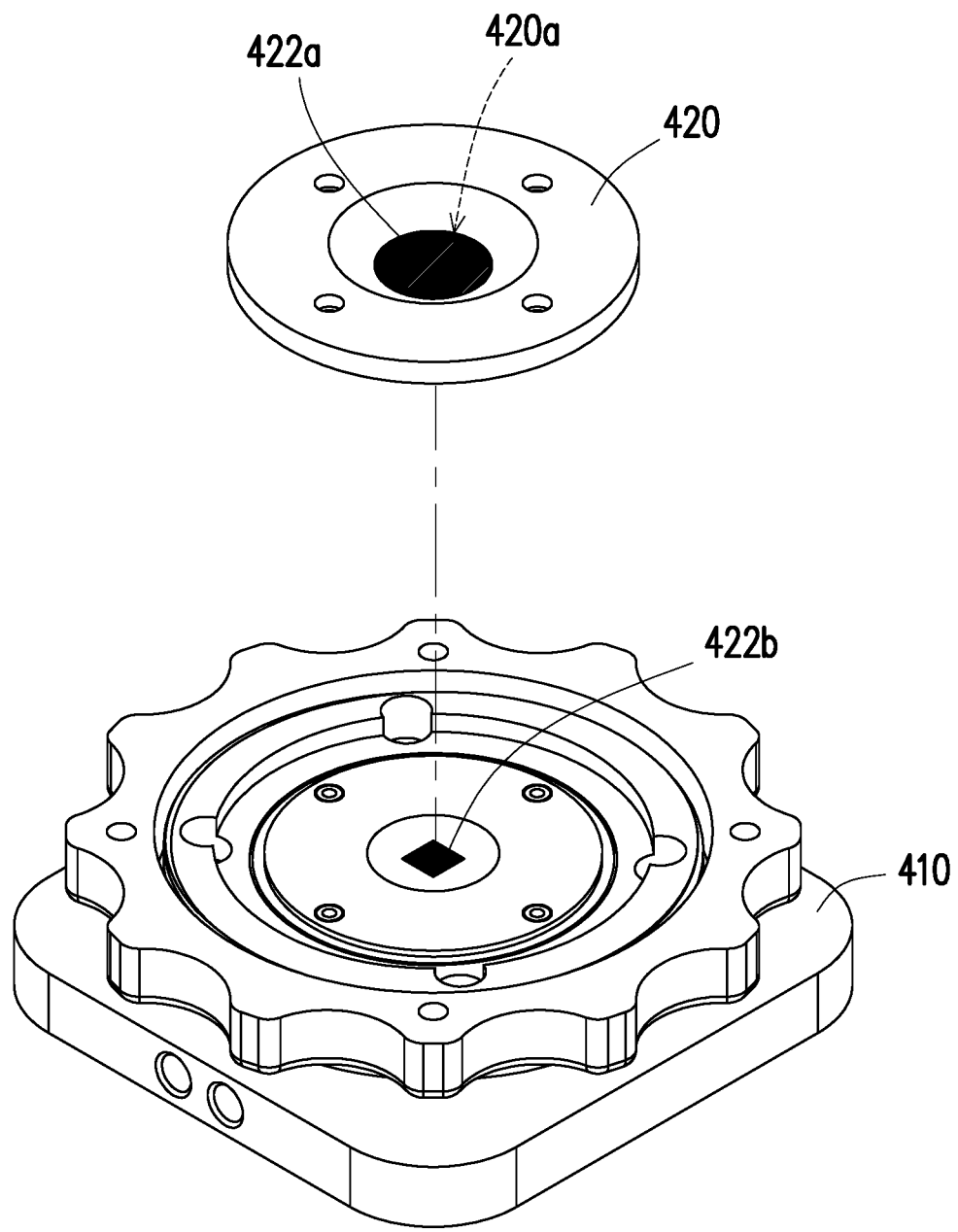
FIG. 12 is an exploded view of the carrier of FIG. 11.

FIG. 10 is a perspective view of the carrier of the microscope according to yet another embodiment of the present disclosure. FIG. 11 is an exploded view of the carrier of FIG. 10. FIG. 12 is an exploded view of the carrier of FIG. 11. In the embodiment shown in FIG. 10 to FIG. 12, a bottom base 410, an upper cover 420, an observing region 420a, a semiconductor component 422a, and a semiconductor component 422b are configured and functioned in an identical or similar manner as the bottom base 310, the upper cover 320, the observing region 320a, the semiconductor component 322a, and the semiconductor component 322b in FIG. 6 to FIG. 8, and thus related descriptions are omitted. The difference between the embodiment shown in FIG. 10 to FIG. 12 and the embodiment shown in FIG. 6 to FIG. 8 is that a fastening assembly 450 is locked to the bottom base 410 through its locking hole 450a, so that the upper cover 420 is fastened downward to the bottom base 410 by the fastening assembly 450.

Figure 13:
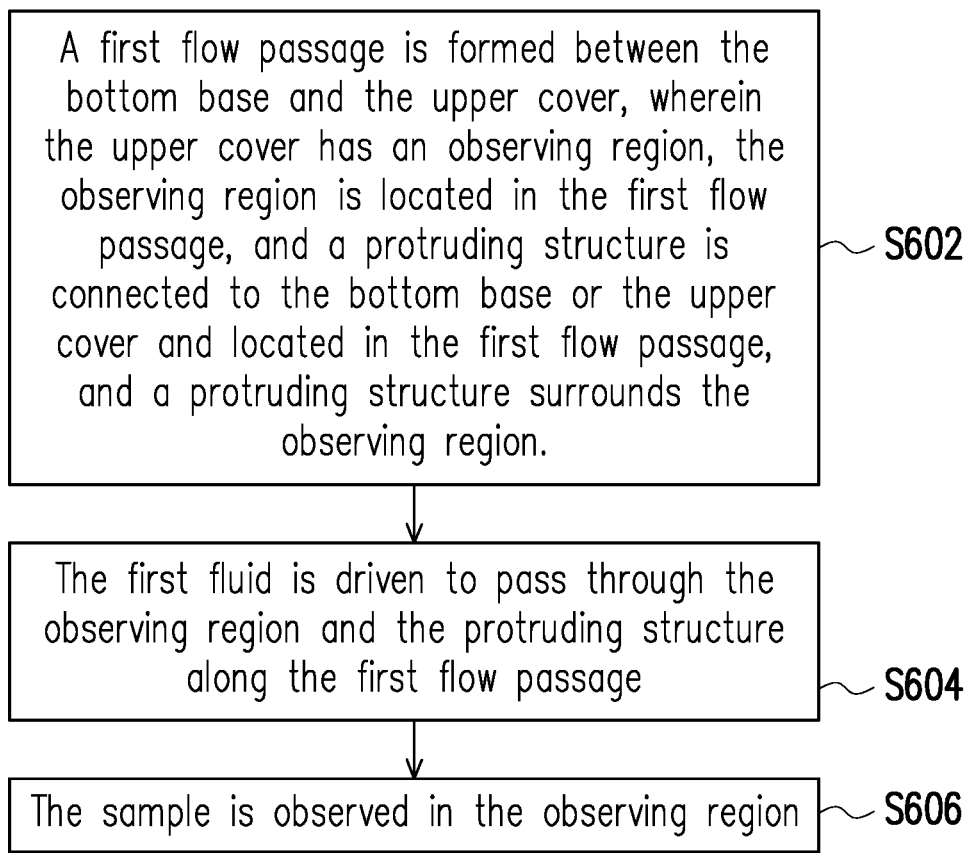
FIG. 13 is a flow chart showing an operation method of the microscope according to an embodiment of the present disclosure.

The operation method of the microscope of the present disclosure will be described below with reference to the microscope 100 shown in FIG. 1 to FIG. 4. FIG. 13 is a flow chart showing an operation method of the microscope according to an embodiment of the present disclosure. Referring to FIG. 13, first, the first flow passage F1 is formed between the bottom base 110 and the upper cover 120. The upper cover 120 has an observing region 120a. The observing region 120a is located in the first flow passage F1, and the protruding structure 130 is connected to the bottom base 110 or the upper cover 120 and located in the first flow passage F1 (step S602). The first fluid is driven to pass through the observing region 120a and the protruding structure 130 along the first flow passage F1 (step S604). The sample is observed in the observing region 120a (step S606).

In the flow process of the above operation method, the following steps can be further performed. The observing region 120a is formed through the semiconductor component 122 on the upper cover 120, so that the upper cover 120 is fastened to the bottom base 110 through the fastening assembly 150. The electron beam E is supplied to the observing region 120a by the electron source 140, and at least part of the first fluid flows along the slow-flow passage P shown in FIG. 3. The second fluid is driven to flow along the second flow passage F2 to adjust the temperature of the first fluid, wherein the second fluid is contacted by the thermal conductive protrusion 114a in the second flow passage F2, and the temperature of the first fluid is adjusted through the thermal conductive component 112b. The sealing is made between the bottom base 110 and the upper cover 120 by the elastic sealing component 160, wherein the elastic sealing component 160 surrounds the first flow passage F1.

If corresponding to the embodiment shown in FIG. 5, the flow process of the above operation method can further perform the following steps. The first electrode 230a is brought into contact with the upper cover 220, and the sample is brought into contact with the upper cover 220 to be electrically connected to the first electrode 230a through the upper cover 220, so that the sample is in contact with and electrically connected to the second electrode 230b.

If corresponding to the embodiment shown in FIG. 6 to FIG. 9, the flow process of the above operation method can further perform the following steps. The movable component 312b abuts against the protruding structure through the elastic force of the elastic component 312c, and the semiconductor component 322b on the bottom base 310 is aligned with the semiconductor component 322a on the upper cover 320. A flow-guiding passage is formed between the two semiconductor components 322a, 322b by the protruding structure on one of the two semiconductor components 322a, 322b. Also, after the sample is observed, the upper cover 320 is discarded.

Figure 14:
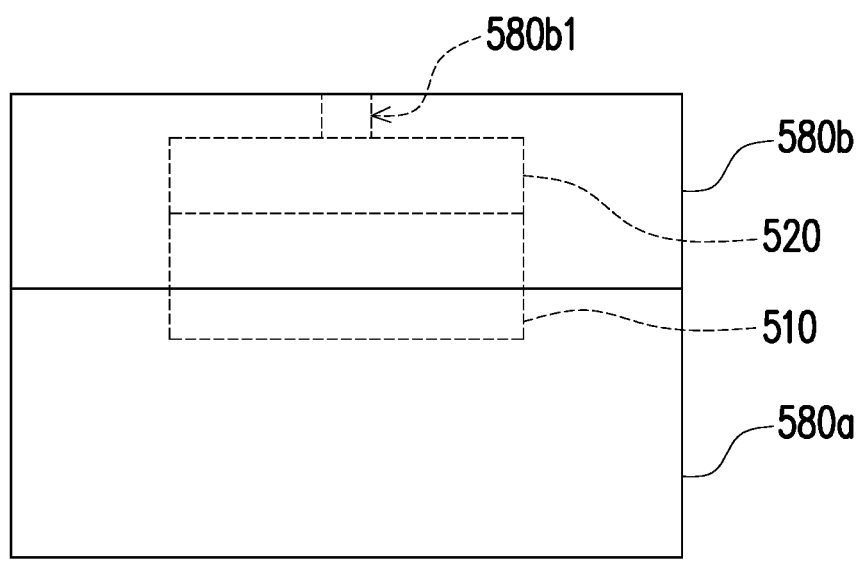
FIG. 14 is a schematic view of some components of a microscope according to another embodiment of the present disclosure.
Figure 15:
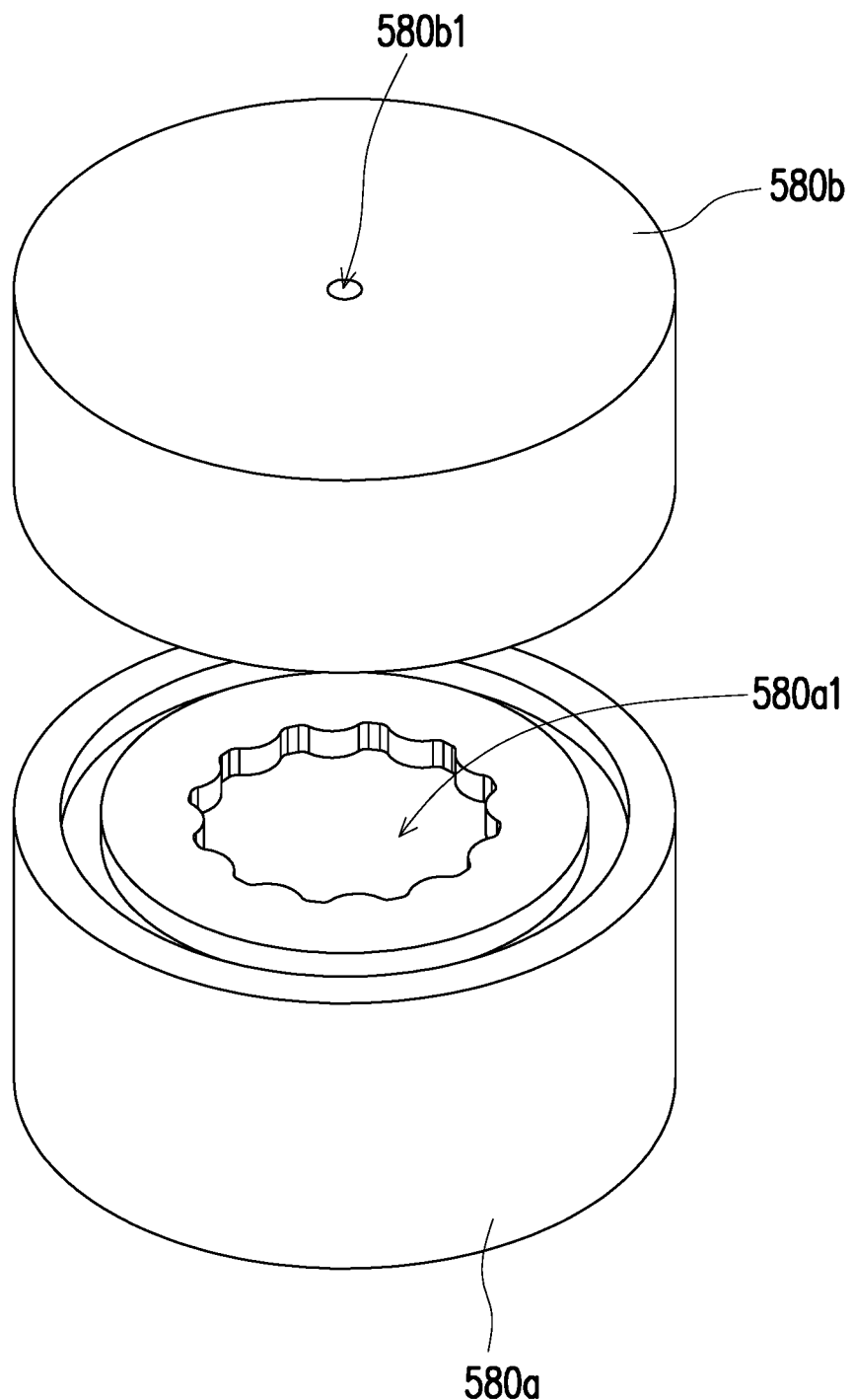
FIG. 15 is a perspective view of a fixture of FIG. 14.

In some embodiments, the fixture can be utilized to combine the upper cover and the bottom base, as will be explained below with reference to the drawings. FIG. 14 is a schematic view of some components of a microscope according to another embodiment of the present disclosure. FIG. 15 is a perspective view of a fixture of FIG. 14. Referring to FIG. 14 and FIG. 15, in the embodiment, a bottom base 510, an upper cover 520 and the corresponding protruding structure are configured and functioned in an identical or similar way as the bottom base 310, the upper cover 320 and the corresponding protruding structure shown in FIG. 6 to FIG. 9, and thus related descriptions are omitted. The microscope shown in FIG. 14 and FIG. 15 further includes two fixtures 580a and 580b. The two fixtures 580a and 580b respectively have, for example, fitting slots (FIG. 15 depicts the fitting slot 580a1 of the fixture 580a) corresponding to the shapes of the bottom base 510 and the upper cover 520, respectively, so that the upper cover 520 and the bottom base 510 can be respectively engaged with the two fixtures 580a, 580b, and the two fixtures 580a, 580b can rotate relative to each other to drive the upper cover 520 and the bottom base 510 to rotate relative to each other. In this manner, the upper cover 520 can be fastened to the bottom base 510 through the fastening assembly 350 identical with or similar to the one shown in FIG. 6 to FIG. 9. Since the upper cover 520 and the bottom base 510 can be covered by the two fixtures 580a and 580b, the two fixtures 580a and 580b also have the function of accommodating and protecting the upper cover 520 and the bottom base 510. In addition, in the embodiment, the fixture 580b can have a guiding through hole 580b1, the guiding through hole 580b1 is aligned with the observing region of the upper cover 520, and a needle is adapted to be inserted into the guiding through hole 580b1 and guided through the guiding through hole 580b1 to be aligned with the observing region and injects the sample into the observing region. The shape of the guiding through hole 580b1 shown in FIG. 14 is only for schematic purpose, and the guiding through hole 580b1 may be a tapered hole or a non-tapered hole, the present disclosure provides no limitation thereto.

Figure 16:
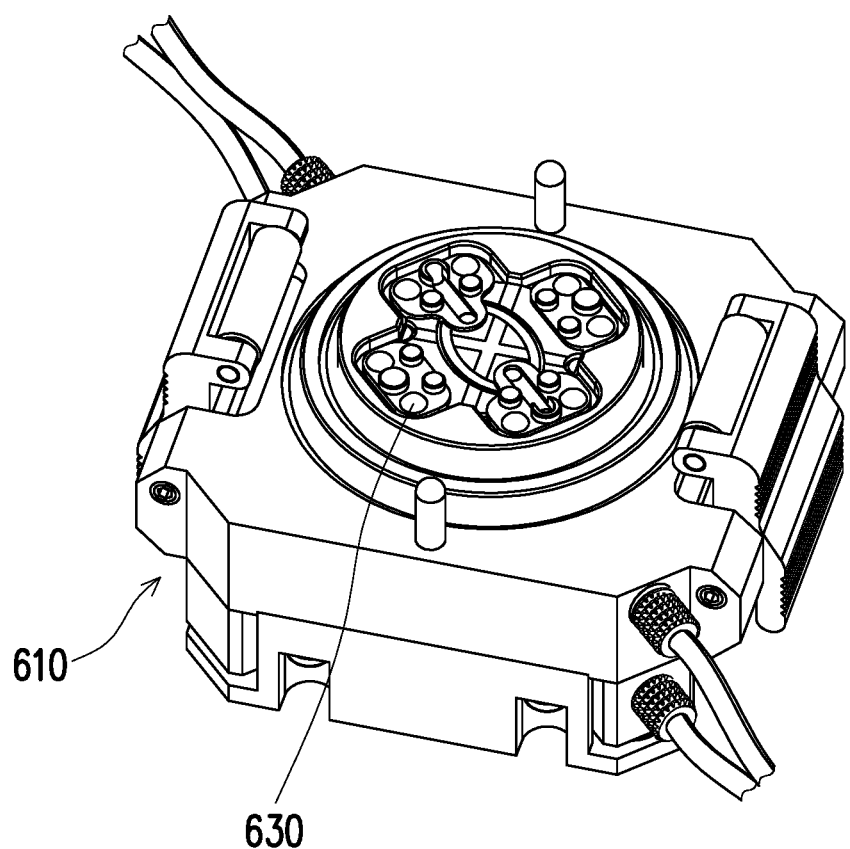
FIG. 16 is a perspective view of some parts of a microscope according to still another embodiment of the present disclosure.

In some embodiments, in the case where the protruding structure is composed of electrodes, the second electrode 230b may be arranged in an annular manner as shown in the embodiment of FIG. 5, and may further be arranged in other manners, which is further described with reference to drawings. FIG. 16 is a perspective view of some parts of a microscope according to still another embodiment of the present disclosure. The configuration and function of the bottom base 610 of FIG. 16 are the same as or similar to that of the bottom base 210 of FIG. 5, and details are not described herein again. The difference between the embodiment shown in FIG. 16 and the embodiment shown in FIG. 5 is that the electrodes 630 for forming the protruding structure of FIG. 16 are arranged in an octagonal manner.

Figure 17:
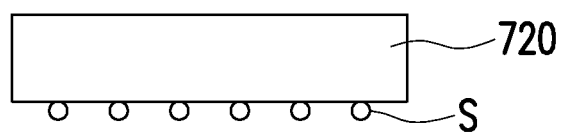
FIG. 17 is a partial schematic view of a microscope according to yet another embodiment of the present disclosure.
Figure 17:
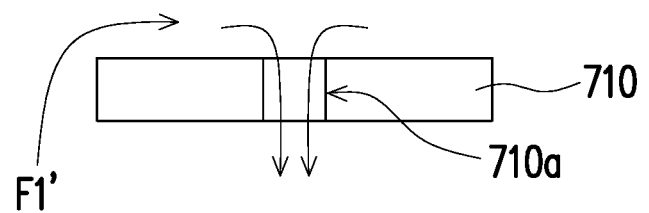

In some embodiments, the sample may be precipitated through the fluid discharged from the flow passage, as explained below with reference to drawings. FIG. 17 is a partial schematic view of a microscope according to yet another embodiment of the present disclosure. The configuration and function of a bottom base 710, an upper cover 720, and a first flow passage F1" of FIG. 17 are the same as or similar to that of the bottom base, the upper cover, and the first flow passage of the foregoing embodiment, and thus related descriptions are omitted. In the embodiment of FIG. 17, the bottom base 710 has at least one opening 710a, and the first fluid in the first flow passage F1" is adapted to leave the first flow passage F1" through the opening 710a to precipitate the sample S in the observing region of the upper cover 720 for observation. The opening or closing of the opening 710a is controlled by a suitable valve or a similar structure, and the present disclosure provides no limitation thereto.

Figure 18:
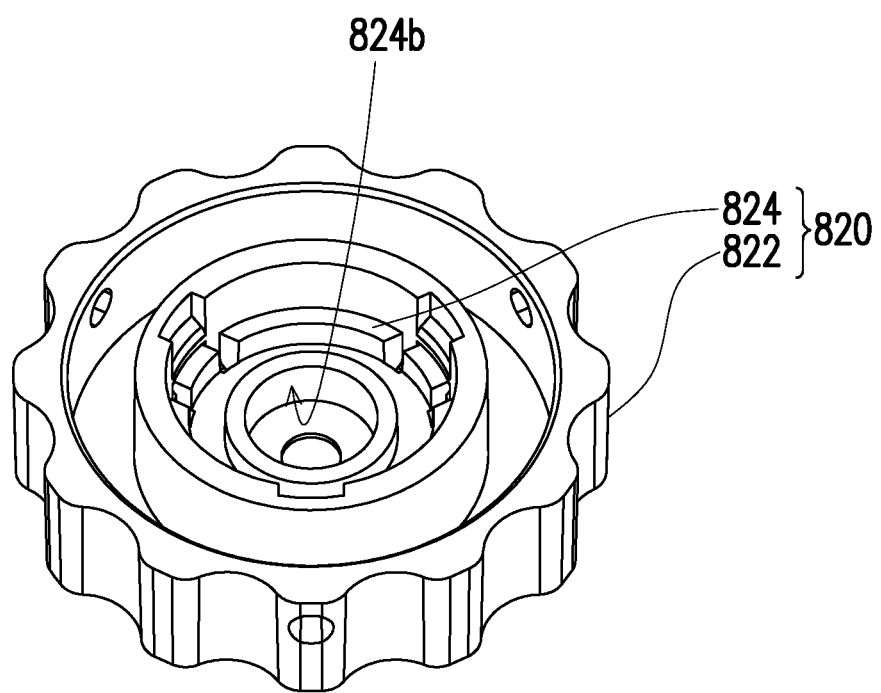
FIG. 18 is a perspective view of an upper cover according to another embodiment of the present disclosure.
Figure 19:
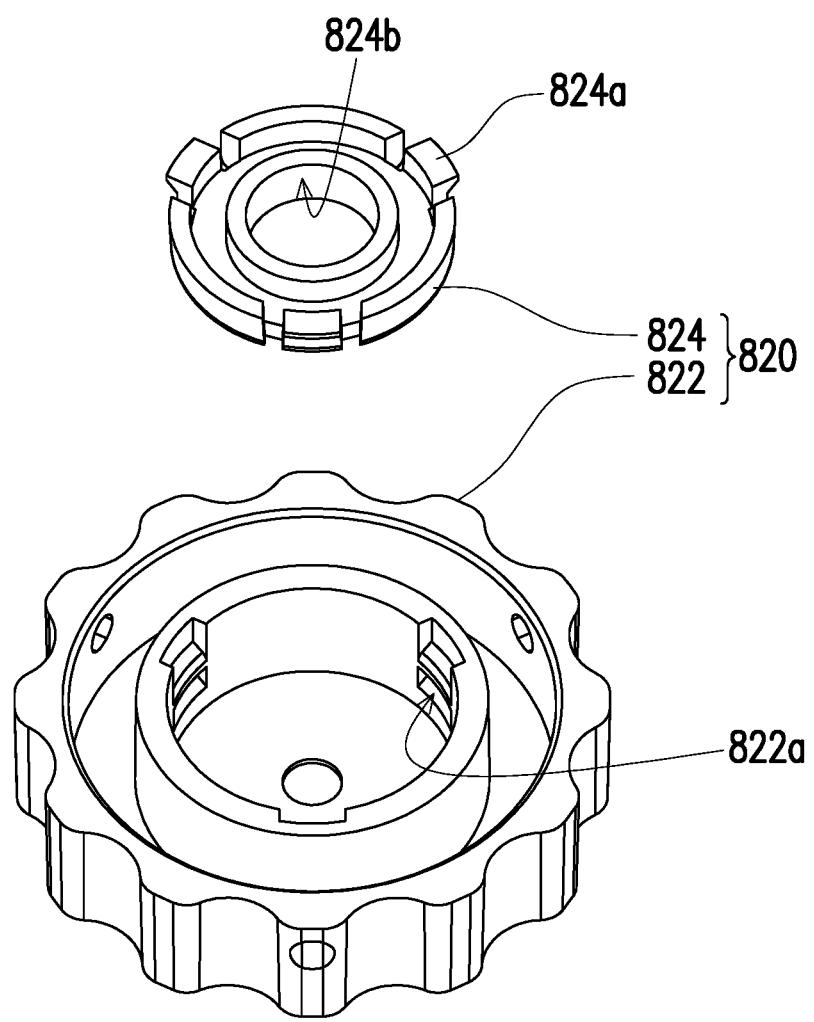
FIG. 19 is an exploded view of the upper cover of FIG. 18.

In some embodiments, the semiconductor component can be fixed by a latching component, which will be described below with reference to the drawings. FIG. 18 is a perspective view of an upper cover according to another embodiment of the present disclosure. FIG. 19 is an exploded view of the upper cover of FIG. 18. The main difference between the upper cover 820 of FIG. 18 and FIG. 19 and the upper cover of the foregoing embodiment is that the upper cover 820 includes an upper cover body 822 and a latching component 824. The latching component 824 is engaged with the engaging slot 822a of the upper cover body 822 through its hook 824a, thereby clamping and positioning the semiconductor component (the semiconductor component 322a shown in FIG. 8) between the latching component 824 and the upper cover body 822. The latching component 824 has an opening 824b aligned with the observing region of the upper cover 820 for observation.

Figure 20:
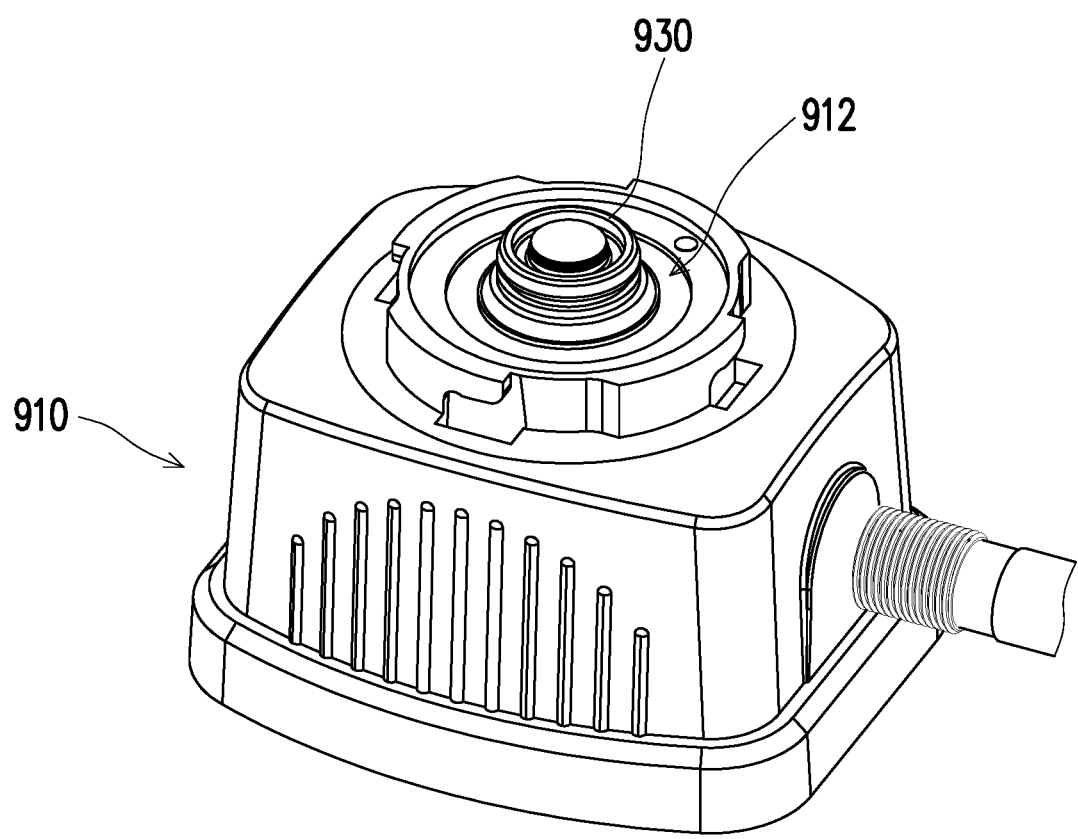
FIG. 20 is a perspective view of some parts of a microscope according to another embodiment of the present disclosure.

In some embodiments, the protruding structure may be a structure on the bottom base for preventing leakage of fluid, which will be described below with reference to drawings. FIG. 20 is a perspective view of some parts of a microscope according to another embodiment of the present disclosure.

The configuration and function of the bottom base 910 of FIG. 20 are the same as or similar to the configuration and function of the bottom base of the foregoing embodiment, and details are not described herein again. The bottom base 910 of FIG. 20 differs from the bottom base of the previous embodiment in that the bottom base 910 has a carrying portion 912 and a protruding structure 930 is formed on the carrying portion 912. The sample is adapted to be carried by the carrying portion 912 and surrounded by the protruding structure 930. The protruding structure 930 serves to prevent the fluid at the sample from leaking.

Figure 21:
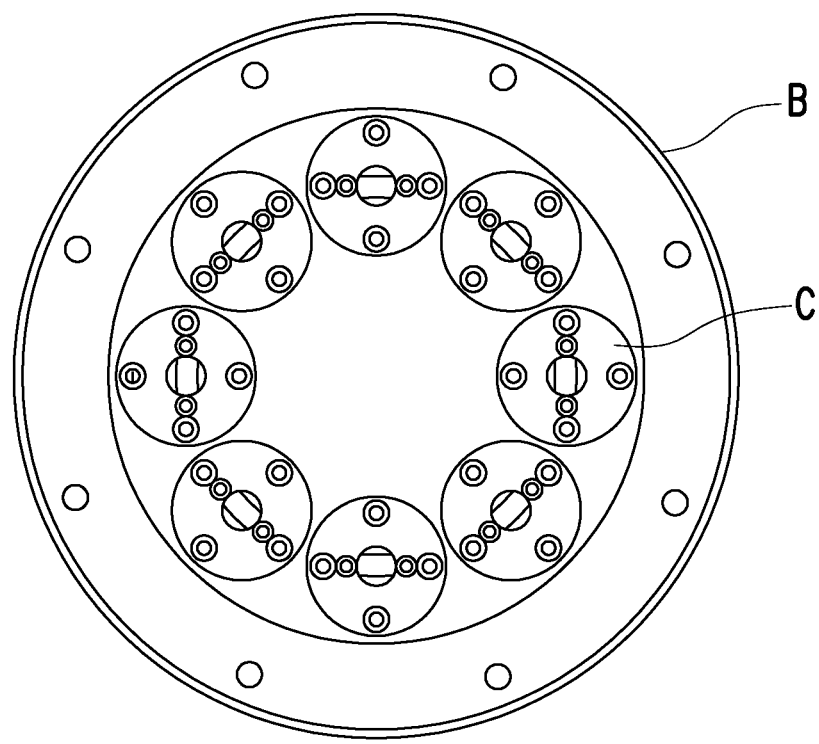
FIG. 21 is a schematic view of some components of a microscope according to yet another embodiment of the present disclosure.

In some embodiments, the number of carriers can be multiple, which will be explained below with reference to drawings. FIG. 21 is a schematic view of some components of a microscope according to yet another embodiment of the present disclosure. The configuration and function of each carrier C of FIG. 21 are the same as or similar to that of the previous embodiment, and will not be described again. The microscope of the embodiment shown in FIG. 21 includes a base B, and the number of the carrier C is multiple. The base B is adapted to carry the carriers C to facilitate observation of a greater number of samples.

In summary, in the microscope of the present disclosure, a protruding structure is added to the carrier. The protruding structure may be a slow-flow structure, which forms a slow-flow passage around an observing region of a sample (e.g., a biological cell liquid sample, etc.), so that at least a portion of the first fluid entering the first flow passage flows along the slow-flow passage, thereby avoiding the first fluid from passing through the observing region of the sample in a large amount instantaneously, and thus reducing the degree of disturbance when the first fluid flows through the sample. In this manner, the user can smoothly observe the sample with the microscope. In addition, the protruding structure may be an electrode located in the first flow passage to contact a sample (e.g., a battery material sample, etc.) and electrify the sample to facilitate observation of the sample.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A microscope, adapted to observe a sample, the microscope comprising at least one carrier, the at least one carrier comprising:
   a bottom base;
   an upper cover, disposed on the bottom base and having an observing region, wherein the sample is adapted to be observed in the observing region, and a first flow passage is formed between the bottom base and the upper cover, the observing region is located in the first flow passage, a first fluid adapted to pass through the observing region along the first flow passage; and
   a protruding structure, connected to the bottom base or the upper cover and located in the first flow passage, wherein the protruding structure surrounds the observing region.

2. The microscope according to claim 1, wherein the at least one carrier comprises a fastening assembly, the upper cover is fastened to the bottom base through the fastening assembly.

3. The microscope according to claim 2, comprising two fixtures, wherein the upper cover and the bottom base are adapted to be respectively engaged with the two fixtures, the two fixtures are adapted to be rotated relative to each other such that the upper cover is fastened to the bottom base through the fastening assembly.

4. The microscope according to claim 1, comprising at least one fixture, wherein the upper cover is adapted to be engaged with the at least one fixture, the at least one fixture has a guiding through hole, the guiding through hole is aligned with the observing region, a needle is adapted to be inserted into the guiding through hole and guided by the guiding through hole to be aligned with the observing region, and injects the sample into the observing region.

5. The microscope according to claim 1, wherein the microscope is an electron microscope and comprises an electron source adapted to provide an electron beam to the observing region.

6. The microscope according to claim 1, wherein the protruding structure forms a slow-flow passage around the observing region.

7. The microscope according to claim 1, wherein the bottom base has a second flow passage, and the second flow passage has a plurality of thermal conductive protrusions, and the first flow passage and the second flow passage are stacked on each other, a second fluid is adapted to flow along the second flow passage to adjust a temperature of the first fluid.

8. The microscope according to claim 1, wherein the at least one carrier comprises at least one elastic sealing component disposed between the bottom base and the upper cover and surrounding the first flow passage.

9. The microscope according to claim 1, wherein the bottom base comprises a base body, a movable component and at least one elastic component, the elastic component is connected between the bottom base and the movable component, and the observing region is aligned with the movable component, the protruding structure is connected to the upper cover, and the movable component is adapted to abut against the protruding structure by an elastic force of the elastic component.

10. The microscope according to claim 1, wherein the bottom base comprises a base body and a thermal conductive component, the base body surrounds the thermal conductive component, and the observing region is aligned with the thermal conductive component, and the thermal conductive component has a thermal conductivity greater than a thermal conductivity of the base body.

11. The microscope according to claim 1, wherein the at least one carrier comprises a semiconductor component, the semiconductor component is disposed on the upper cover to form the observing region.

12. The microscope according to claim 11, wherein the at least one carrier comprises another semiconductor component, the two semiconductor components are respectively disposed on the bottom base and the upper cover and aligned with each other.

13. The microscope according to claim 12, wherein the protruding structure is formed on one of the two semiconductor components and forms a flow-guiding passage between the two semiconductor components.

14. The microscope according to claim 11, wherein the upper cover comprises an upper cover body and a latching component, the latching component is engaged with the upper cover body, and the semiconductor component is positioned between the latching component and the upper cover body.

15. The microscope according to claim 14, wherein the latching component has an opening, the opening is aligned with the observing region.

16. The microscope according to claim 1, wherein the at least one carrier comprises at least one first electrode disposed on the bottom base and contacting the upper cover, the protruding structure comprises at least one second electrode, the second electrode is disposed on the bottom base, the sample is adapted to contact the upper cover to be electrically connected to the first electrode through the upper cover, and the sample is adapted to be in contact with and electrically connected to the second electrode.

17. The microscope according to claim 1, wherein the upper cover is a disposable upper cover.

18. The microscope according to claim 1, wherein the bottom base has an opening, the first fluid is adapted to leave the first flow passage through the opening to precipitate the sample in the observing region.

19. The microscope according to claim 1, wherein the bottom base has a carrying portion, the protruding portion is formed on the carrying portion, the sample is adapted to be carried by the carrying portion and surrounded by the protruding structure.

20. The microscope according to claim 1, comprising a base, wherein the number of the at least one carrier is plural, and the base is adapted to carry the carriers.

* * * * *